(12) United States Patent
Park et al.

(10) Patent No.: US 7,872,249 B2
(45) Date of Patent: Jan. 18, 2011

(54) NONVOLATILE MEMORY DEVICE AND METHODS OF OPERATING AND FABRICATING THE SAME

(75) Inventors: Yoon-dong Park, Yongin-si (KR); Myoung-jae Lee, Yongin-si (KR); Dong-chul Kim, Yongin-si (KR); Seung-eon Ahn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 602 days.

(21) Appl. No.: 11/723,018

(22) Filed: Mar. 15, 2007

(65) Prior Publication Data

US 2008/0012064 A1 Jan. 17, 2008

(30) Foreign Application Priority Data

Apr. 21, 2006 (KR) ............. 10-2006-0036408

(51) Int. Cl.
*H01L 47/00* (2006.01)
(52) U.S. Cl. ................. 257/2; 257/63; 257/316; 257/646; 438/268
(58) Field of Classification Search ............ 257/2, 257/63, 316, 646; 438/268
See application file for complete search history.

(56) References Cited

U.S. PATENT DOCUMENTS

| 6,570,788 | B1 | 5/2003 | Nakamura |
| 7,259,387 | B2 | 8/2007 | Kawazoe et al. |
| 2006/0006457 | A1 | 1/2006 | Ono |

*Primary Examiner*—Long Pham
(74) *Attorney, Agent, or Firm*—Harness, Dickey & Pierce, P.L.C.

(57) ABSTRACT

Provided is a nonvolatile memory device and method of operating and fabricating the same for higher integration and higher speed, while allowing for a lower operating current. The nonvolatile memory device may include a semiconductor substrate. Resistive layers each storing a variable resistive state may be formed on the surface of the semiconductor substrate. Buried electrodes may be formed on the semiconductor substrate under the resistive layers and may connect to the resistive layers. Channel regions may be formed on the surface of the semiconductor substrate and connect adjacent resistive layers to each other, but not to the buried electrodes. Gate insulating layers may be formed on the channel regions of the semiconductor substrate. Gate electrodes may be formed on the gate insulating layers and extend over the resistive layers.

28 Claims, 10 Drawing Sheets

NONVOLATILE MEMORY DEVICE AND METHODS OF OPERATING AND FABRICATING THE SAME

PRIORITY STATEMENT

This application claims priority under 35 USC §119 to Korean Patent Application No. 2006-0036408, filed on Apr. 21, 2006, in the Korean Intellectual Property Office (KIPO), the entire contents of which are herein incorporated by reference.

BACKGROUND

1. Field

Example embodiments relate to a nonvolatile memory device including resistive nodes and methods of operating and fabricating the same.

2. Description of the Related Art

Nonvolatile memory devices (e.g., phase-change RAM (PRAM) devices or resistance RAM (RRAM) devices) operate by varying the resistance of resistive nodes. As semiconductor products demand higher data capacity, higher integration and more operation bits of the nonvolatile memory device may be required. As such, multi-bit nonvolatile memory devices are increasingly required.

Because faster data processing speed may be required to process extra data, it is necessary for nonvolatile memory devices to have higher operating speed and higher data capacity. For example, the operating speed of flash memory devices may be increased by using block erasing and/or flash erasing method.

Increased integration of nonvolatile memory devices has led to efforts in decreasing the operating current of the devices. However, nonvolatile memory devices using resistive nodes require a higher operating current. Decreasing the operating current may affect the variable resistance of the resistive nodes. Accordingly, conventional nonvolatile memory devices may have restrictions in decreasing the operating current.

For example, PRAM stores data using a resistance change resulting from changes of the crystalline state of a resistor. A higher current density, which limits the minimum operating current, may be needed to change the crystalline state of the PRAM device. Higher operating current causes short channel effects and inhibits advances in the integration of the PRAM. Therefore, attempts have been made to obtain a higher current density with a lower operating current by decreasing the size of the crystalline state change region of a phase change resistor.

SUMMARY

Example embodiments provide a nonvolatile memory device and having a lower operating current and/or enabling higher integration and higher speed. Example embodiments also provide a method of achieving higher operating speed and a method of economically fabricating the nonvolatile memory device.

Example embodiments provide a nonvolatile memory device comprising a semiconductor substrate including a plurality of resistive layers on the semiconductor substrate storing a variable resistive state, a plurality of buried electrodes in the semiconductor substrate portions under the plurality of resistive layers and connecting to the plurality of resistive layers, and a plurality of channel regions on the surface of the semiconductor substrate connecting adjacent resistive layers to each other but not to the buried electrodes. The nonvolatile memory device may further include gate insulating layers on the channel regions of the semiconductor substrate and gate electrodes on the gate insulating layers extending over the plurality of resistive layers.

The first and second resistive layers may be composed of a material with a resistive state which varies according to the voltage supplied to both the first and second resistive layers. The first and second resistive layers may each be composed of at least one material selected from the group consisting of $Nb_2O_5$, Cr-doped $SrTiO_3$, $ZrO_x$, $GST(GeSb_xTe_y)$, NiO, ZnO, $TiO_2$, and HfO. A plurality of bit lines on the semiconductor substrate may be connected to the plurality of buried electrodes.

According to example embodiments, a nonvolatile memory device may include a plurality of unit layer structures stacked as multiple layers. Each of the plurality of unit layer structures may include a semiconductor substrate. A plurality of resistive layers storing a variable resistive state may be formed on the surface of the semiconductor substrate. A plurality of buried electrodes connected to the plurality of resistive layers may be formed on the semiconductor substrate under the plurality of resistive layers. A plurality of channel regions may be formed on the surface of the semiconductor substrate and may connect adjacent resistive layers to each other but not to the buried electrodes. Gate insulating layers may be formed on the channel regions of the semiconductor substrate. Gate electrodes may be formed on the gate insulating layers and may extend over the plurality of resistive layers.

According to example embodiments, a nonvolatile memory device may include a plurality of unit cells arranged in a matrix. The unit cells each may include a control device including a gate, a source and a drain, and a first resistive node storing a variable resistive state having one end connected to the source of the control device. The plurality of unit cells each may include a second resistive node storing a variable resistive state having one end connected to the drain of the control device. A plurality of word lines arranged in a plurality of rows may be connected to the gates of the control devices of the unit cells in each row. A plurality of bit lines may be arranged in a plurality of columns and may connect to the other end of a first resistive node or a second resistive node located in two adjacent columns of the plurality of unit cells.

Example embodiments provide a method of operating the nonvolatile memory device. When programming, data may be stored in two adjacent resistive layers. When flash erasing, data stored in a predetermined or given number of resistive layers may be simultaneously erased. Flash erasing may include supplying a turn-on voltage to the gate electrode and supplying an erase voltage between the buried electrodes connected to two resistive layers and located under the predetermined or given number of the resistive layers.

The fabricating method according to the example embodiments may include a plurality of channel regions being formed on the surface of a semiconductor substrate and a plurality of buried electrodes being formed within the semiconductor substrate between the plurality of channel regions. The plurality of buried electrodes may be deeper within the substrate than the plurality of channel regions. A plurality of resistive layers storing a variable resistive state may be formed on the plurality of buried electrodes and may connect to the ends of the plurality of channel regions. Gate insulating layers may be formed on the channel regions of the semiconductor substrate. Gate electrodes may be formed on the gate insulating layers and may extend over the plurality of resistive layers.

BRIEF DESCRIPTION OF THE DRAWINGS

Example embodiments will be more clearly understood from the following detailed description taken in conjunction with the accompanying drawings.

FIG. 1 is a circuit diagram illustrating the arrangement of a nonvolatile memory device according to example embodiments;

FIG. 2 is a schematic illustrating the structure of the nonvolatile memory device according to example embodiments;

FIG. 3 is a cross-sectional view illustrating the nonvolatile memory device of FIG. 2;

FIG. 4 is a graph illustrating voltage-current characteristics of a resistive node of the nonvolatile memory device according to example embodiments;

FIG. 5 is a circuit diagram illustrating programming of the nonvolatile memory device according to example embodiments;

FIG. 6 is a cross-sectional view illustrating programming of the nonvolatile memory device according to example embodiments;

FIG. 7 is a circuit diagram illustrating flash erasing of the nonvolatile memory device according to example embodiments;

FIG. 8 is a cross-sectional view illustrating flash erasing of the nonvolatile memory device according to example embodiments;

FIG. 9 is a schematic illustrating the structure of a nonvolatile memory device according to example embodiments; and FIGS. 10 through 15 are cross-sectional views illustrating a method of fabricating the nonvolatile memory device according to example embodiments.

DETAILED DESCRIPTION OF EXAMPLE EMBODIMENTS

Figure 1:
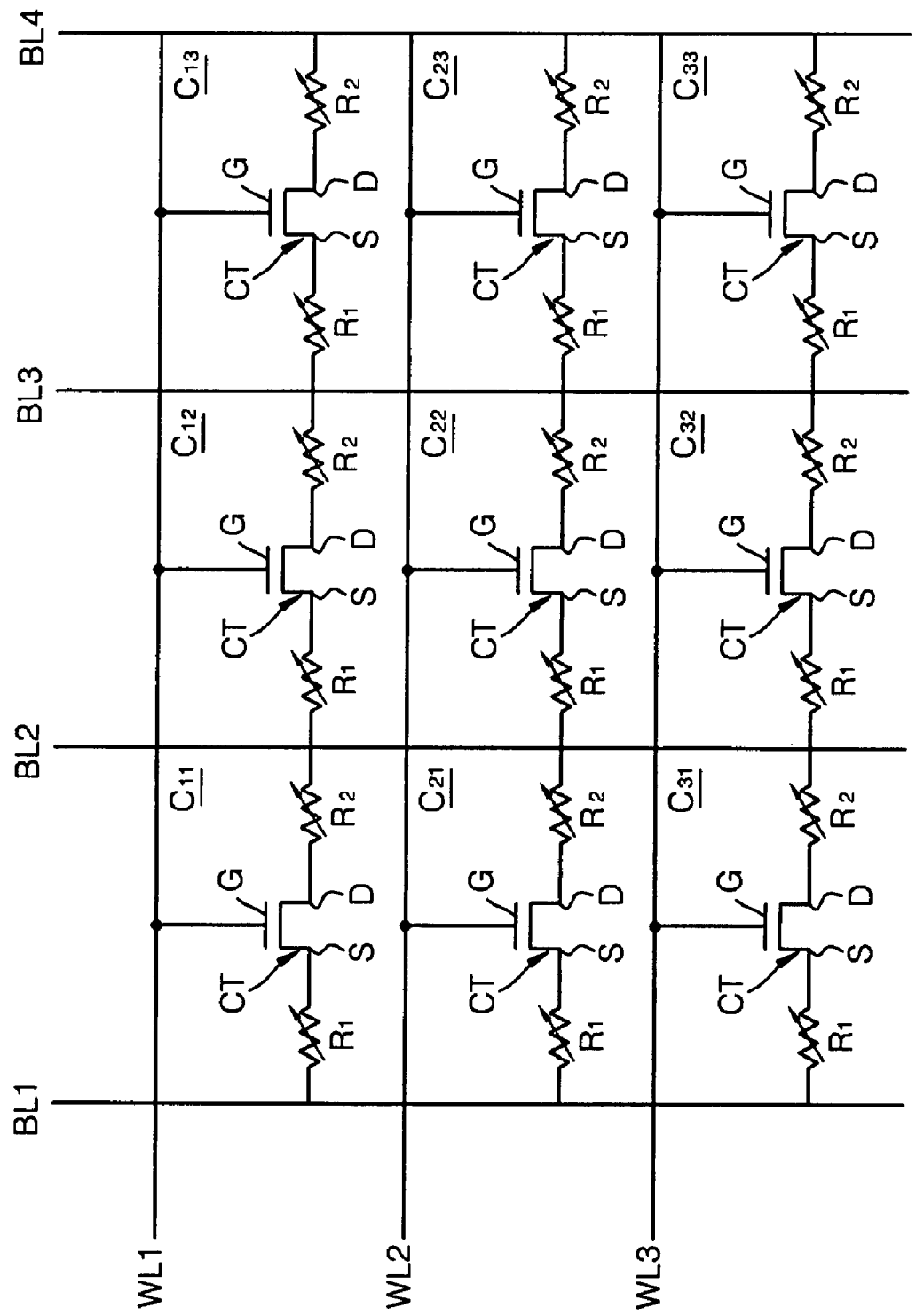
FIGS. 1-15 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A nonvolatile memory device according to example embodiments may store data using a resistive node or a resistive layer. The nonvolatile memory device according to example embodiments may be described with reference to the type of resistive node or resistive layer. For example, the nonvolatile memory device may include a PRAM device or a RRAM device, but the scope of the example embodiments need not be limited to these.

FIG. 1 is a circuit diagram illustrating the arrangement of a nonvolatile memory device according to example embodiments.

Referring to FIG. 1, the nonvolatile memory device may include a plurality of unit cells C11, C12, C13, C21, C22, C23, C31, C32, and C33 arranged in a matrix. The unit cells C11, C12, C13, C21, C22, C23, C31, C32, and C33 may be defined by a plurality of bit lines BL1, BL2, BL3, and BL4 and a plurality of word lines WL1, WL2, and WL3. Each unit cell may include a control device CT, a first resistive node R1, and a second resistive node R2.

The control device CT may include a gate G, a source S, and a drain D. One end of the first resistive node R1 may be connected to the source S of the control device CT and one end of the second resistive node R2 may be connected to the drain D of the control device CT. The plurality of word lines WL1, WL2, and WL3 may form different rows and may connect to the gates G of the control devices CT of corresponding rows. The plurality of bit lines BL1, BL2, BL3, and BL4 may form different columns and may connect to adjacent first resistive nodes R1 and second resistive nodes R2.

For example, the first word line WL1 may be located in the first row and may connect to the gates G of the control devices CT of the unit cells C11, C12 and C13 of the first row. Similarly to the first word line WL1, the second word line WL2 and the third word line WL3 may be located in the second and third rows, respectively. The first bit line BL1 may be connected to one end of the first resistive nodes R1 of the unit cells C11, C21, and C31 of the first column. The second bit line BL2 may be connected to one end of the second resistive nodes R2 of the unit cells C11, C21, and C31 of the first column and to one end of the first resistive node R1 of the unit cells C12, C22, and C32 of the second column. This similar approach may be applied to the third bit line BL3 and the fourth bit line BL4.

The control device CT acts as a switching device and may include a MOSFET. The gate G may control the electrical connection between the source S and the drain D. For example, when a turn-on voltage is supplied to the gate G, the source S and the drain D may be electrically connected. The designation of the source S and the drain D may be formal classifications according to current flow. Thus, the designation of the source S and the drain D may be interchangeable.

The first resistive node R1 and the second resistive node R2 may store data bits in the form of a variable resistive state. For example, the resistive node R1 may have a lower resistive state and resistive node R2 may have a higher resistive state, which may correspond to data "0" and data "1", respectively.

The resistive nodes R1 and R2 may include a material whose resistance changes according to a voltage applied between both R1 and R2. This material may include at least one material selected from the group consisting of $Nb_2O_5$, Cr-doped $SrTiO_3$, $ZrO_x$, GST($GeSb_xTe_y$), NiO, ZnO, $TiO_2$, and HfO. For example, GST may be used for the PRAM device because the resistance of GST changes according to the crystalline state of GST. Also, $Nb_2O_5$, Cr-doped $SrTiO_3$, NiO, or ZnO may be used for the RRAM device because the resistance of these materials varies without a change in the crystalline state of the materials.

Figure 4:
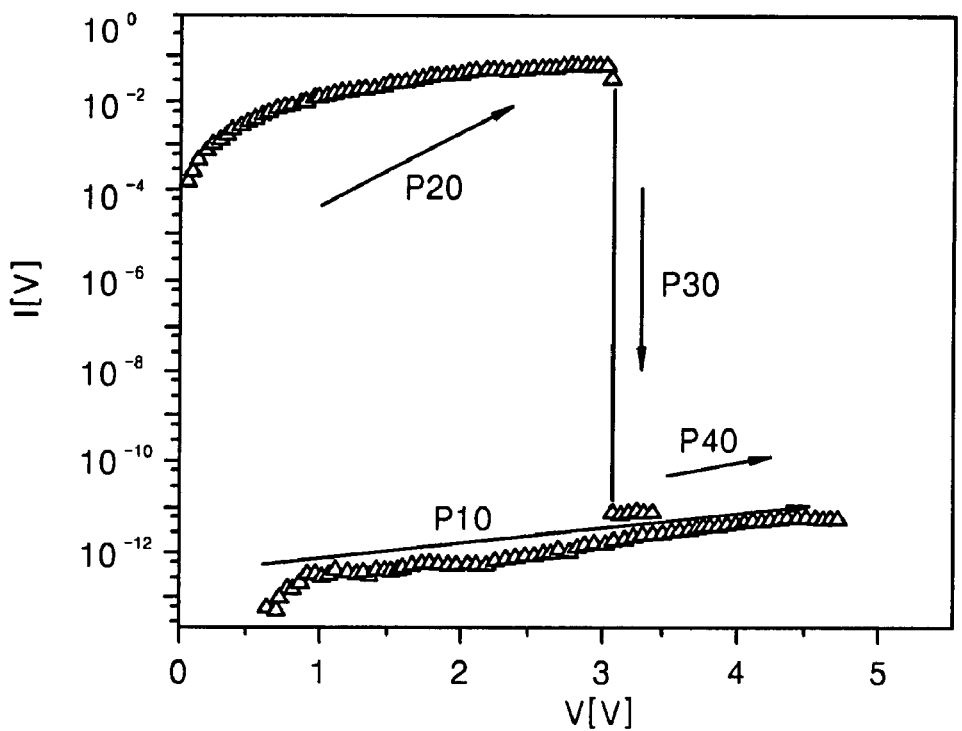

FIG. 4 is a graph illustrating voltage-current characteristics of the resistive node of the nonvolatile memory device according to example embodiments.

Referring to FIG. 4, the voltage-current characteristics of the resistive node used for the RRAM device will be described in more detail. NiO may be used for the resistive node, and the graph may be different if other materials are used for the resistive layer. However, regardless of the material used, the resistance varies according to the voltage supplied.

When an initial voltage is supplied to the resistive node (a path P10), a lower current may flow until a set voltage is reached (e.g., about 4.5V for NiO). Thus, the resistive node may have a higher resistance (reset state). However, when the set voltage is exceeded, the current may increase abruptly. Once the voltage is re-supplied from zero volts (a path P20) after supplying a voltage greater than the set voltage, a higher current may flow. As such, the resistive node may have a lower resistance (set state). However, the current may decrease abruptly when the voltage is increased to a voltage greater than the reset voltage (a path P30). Therefore, the resistance of the resistive node may be restored to the reset state (e.g., a higher resistance). If the voltage is continuously increased prior to reaching the set voltage (a path P40), the path may become identical to the path of the initial reset state.

The above description illustrates that the resistivity of the resistive node may be changed using a threshold voltage (e.g., the set voltage or the reset voltage), as a boundary and the resistivity change may be maintained within a certain voltage range even after the voltage supply is removed. Accordingly, the resistive node may be used as a storage medium of a nonvolatile memory device.

The resistive node described with reference to FIG. 4 is illustrated as an example for use in a RRAM device. The resistive node used for a PRAM device may undergo a resistance change in another manner. The resistive node used for a PRAM device may be referred to as a phase change resistor, whose resistance change characteristics may be well known to those skilled in the art, and thus, will not be described.

It may be obvious that the number of unit cells C11, C12, C13, C21, C22, C23, C31, C32, and C33 are for illustrative purposes and may be changed by those of ordinary skill in the art. The number of bit lines BL1, BL2, BL3, and BL4 and word lines WL1, WL2, and WL3 may also be changed. In addition, the rows and columns of example embodiments are illustrative. Further, it may be obvious that the bit lines BL1, BL2, BL3, and BL4 and word lines WL1, WL2, and WL3 need not be linear, even though they may be arranged in rows and columns.

Figure 2:
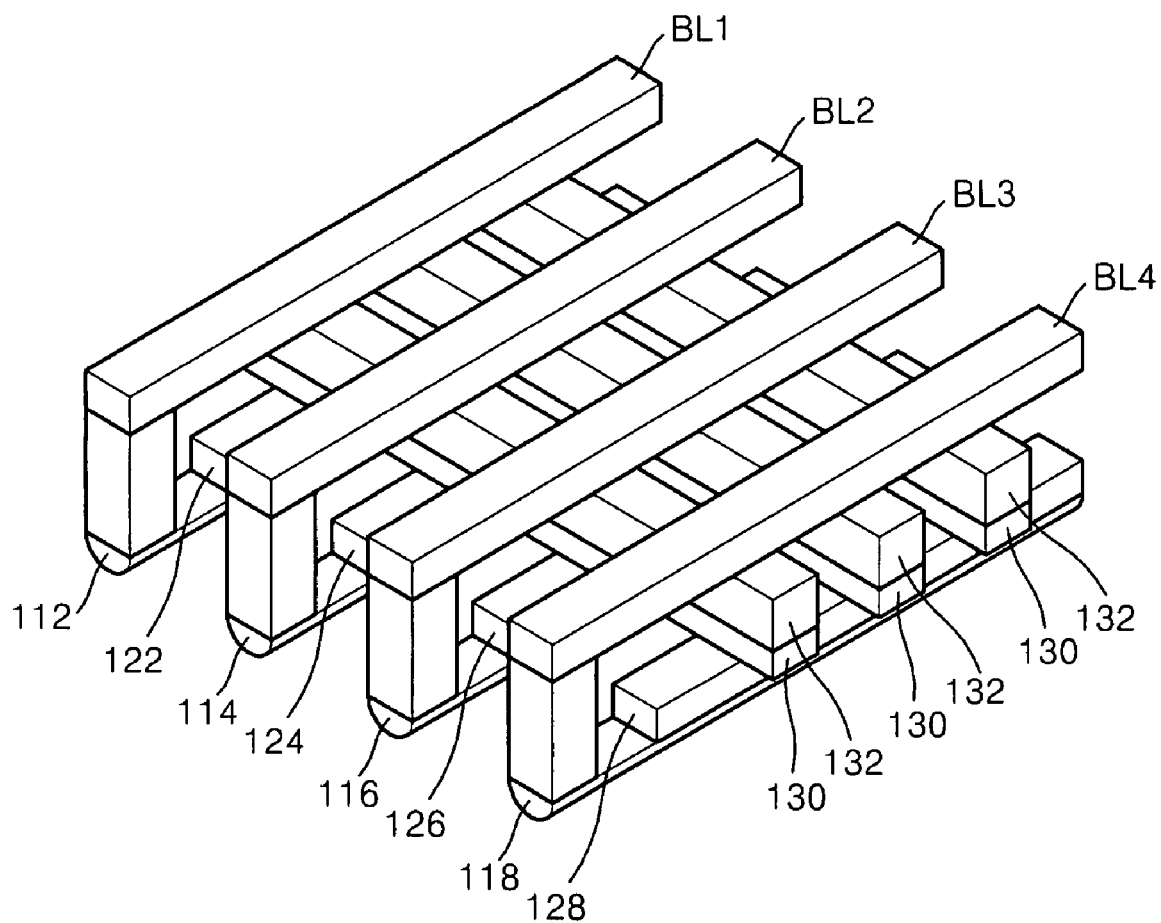
Figure 3:
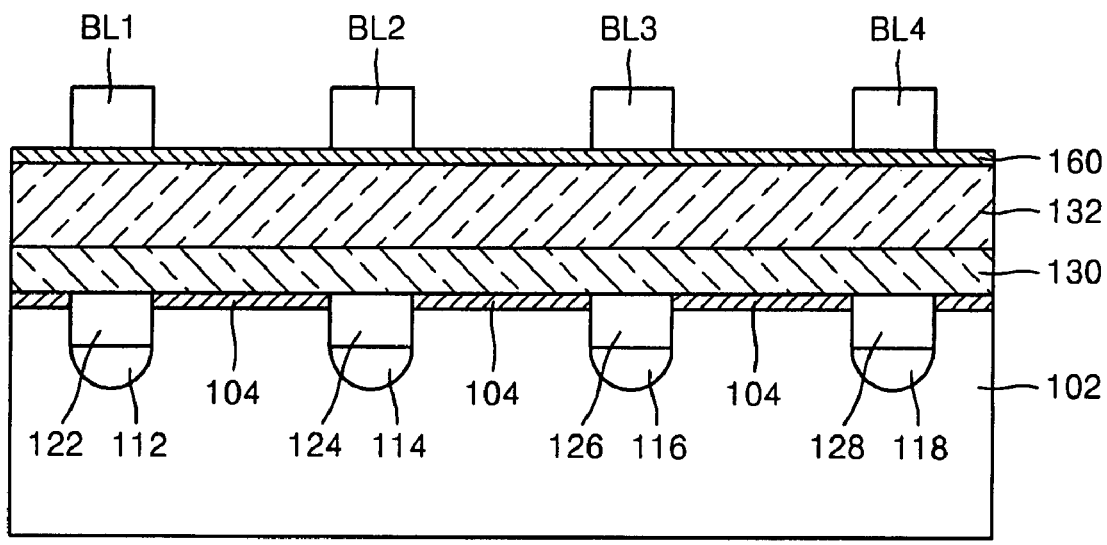

FIG. 2 is a schematic illustrating the structure of a nonvolatile memory device according to example embodiments. FIG. 3 is a cross-sectional view illustrating the nonvolatile memory device of FIG. 2. The structure of the nonvolatile memory device illustrated in FIGS. 2 and 3 corresponds to the circuit arrangement of the nonvolatile memory device illustrated in FIG. 1. Thus, common description will not be repeated.

Referring to FIG. 3, the nonvolatile memory device may include a semiconductor substrate 102 (which is not illustrated in FIG. 2 for ease of description). The semiconductor substrate 102 may be a silicon (Si) wafer, a germanium (Ge) wafer, or a metal-insulator transition (MIT) material. The MIT material may include a transition metal oxide (e.g., $V_2O_5$ or $TiO_x$). The MIT material may be changed from an insulator to a metal by applying a voltage greater than a threshold voltage. The MIT material may be used for forming a multi-layered semiconductor device, as will be described later.

Referring to FIGS. 2 and 3, a plurality of resistive layers 122, 124, 126, and 128 capable of storing a variable resistive state may each be formed on the surface of the semiconductor substrate 102. A plurality of buried electrodes 112, 114, 116, and 118 may be formed on the semiconductor substrate 102 under the resistive layers 122, 124, 126, and 128. A plurality of channel regions 104 may be formed on the surface of the semiconductor substrate 102 to connect adjacent pairs of resistive layers 122, 124, 126, and 128. Gate insulating layers 130 may be formed on the channel regions 104 and may extend over the resistive layers 122, 124, 126, and 128. Bit lines BL1, BL2, BL3, and BL4 may be formed on the semiconductor substrate 102.

The buried electrodes 112, 114, 116, and 118 may be buried within the semiconductor substrate 102. The buried electrodes 112, 114, 116, and 118 may correspond to the sources S or the drains D of FIG. 1. Consecutive buried electrodes 112, 114, 116, and 118 may be alternately referred to as sources S and drains D. The buried electrodes 112, 114, 116, and 118 may be referred to as lower electrodes due to their location.

The buried electrodes 112, 114, 116, and 118 may be formed by doping an impurity in the semiconductor substrate 102. When the semiconductor substrate 102 is doped with an impurity of a first conductivity type, the buried electrodes 112, 114, 116, and 118 may be doped with an impurity of a second conductivity type. The buried electrodes 112, 114, 116, and 118 may form a diode junction with the semiconductor substrate 102. The first conductivity type and the second conductivity type may be an n-type or a p-type.

The buried electrodes 112, 114, 116, and 118 may include a metal layer or a metal silicide layer. The buried electrodes 112, 114, 116, and 118 may form a schottky junction with the semiconductor substrate 102. The schottky junction may rectify the current flow between the buried electrodes 112, 114, 116, and 118 and the semiconductor substrate 102.

The plurality of resistive layers 122, 124, 126, and 128 may correspond to the resistive nodes R1 and R2 of FIG. 1. The resistive layers 122, 124, 126, and 128 each may have a structure in which the first resistive node R1 and the second resistive node R2 of FIG. 1 are directly connected to each other. The left portions of the resistive layers 122, 124, 126, and 128 may correspond to the second resistive nodes R2, and the right portions of the resistive layers 122, 124, 126, and 128 may correspond to the first resistive nodes R1. It may be obvious that although the resistive layers 122, 124, 126, and 128 are illustrated flush with the surface of the semiconductor substrate 102, the resistive layers may protrude further. The resistive layers 122, 124, 126, and 128 may refer to the resistive nodes R1 and R2 of FIG. 1, of which the description will not be repeated.

The plurality of channel regions 104 may be located between the resistive layers 122, 124, 126, and 128 and connect the resistive layers 122, 124, 126, and 128 to one another. Because the channel regions 104 may act as a conductive layer in the turn-on state, they may be used as electrodes. For example, a first channel region 104 may be an upper electrode of the first resistive layer 112 and the second resistive layer 124. However, because the channel regions 104 may be supplied with power only through the buried electrodes 112, 114, 116, and 118, they may not operate as independent electrodes.

The gate insulating layers 130 may insulate the gate electrodes 132 from the first channel region 104 and may extend over the resistive layers 122, 124, 126, and 128. As such, the gate insulating layers 130 may further insulate the resistive layers 122, 124, 126, and 128 from the gate electrodes 132. The thickness of the gate insulating layers 130 may be selected according to the operation voltage and are exaggerated in FIGS. 2 and 3. The gate electrodes 132 correspond to the gates G of FIG. 1. The gate electrode 132 may include a conductive material (e.g., a polysilicon layer or a metal layer).

The bit lines BL1, BL2, BL3, and BL4 may be formed on the gate electrodes 132 by interposing interlayer insulating layers 160. The bit lines BL1, BL2, BL3, and BL4 may be connected to the buried electrodes 112, 114, 116, and 118, respectively. The bit lines BL1, BL2, BL3, and BL4 may extend perpendicular to the gate electrode 132 (e.g., parallel with the buried electrodes 112, 114, 116, and 118). The bit lines BL1, BL2, BL3, and BL4 may include a metal layer.

The nonvolatile memory device described above may have the following structural characteristics.

Contact areas of the resistive layers 112, 114, 116, and 118 and the channel regions 104 may be decreased. When the resistive layers 112, 114, 116, and 118 include the phase change resistor, the phase change may occur only around a portion contacting the channel regions 104. Thus, the phase change region may be decreased to increase the current density. Consequently, a sufficient current density for the phase change may be supplied to the phase change region with a lower operating current. The phase change region in a conventional PRAM device may occupy about $10^3 \sim 10^4$ nm². In example embodiments, because the channel region 104 may have a thickness of about 1~2 nm and a width of about 100 nm, the phase change region may have an area of about 100~200 nm², which may be smaller than the conventional phase change region and may allow for a lower operating current (e.g., reset current of $\frac{1}{10}$ or less).

The integration of the nonvolatile memory device may also be increased. Unlike the conventional memory device which may use a separate control device and electrode structure formed in parallel, the nonvolatile memory device according to example embodiments may use an integral control device and electrode structure. The channel regions 104 may act as the upper electrodes and the resistive layers 122, 124, 126, and 128 may directly contact the channel regions 104 without interposing conductive layers. Consequently, the entire nonvolatile memory device may occupy the same area as a conventional control device, which allows for increased integration.

The operational characteristics of the nonvolatile memory device of example embodiments will now be described.

Figure 5:
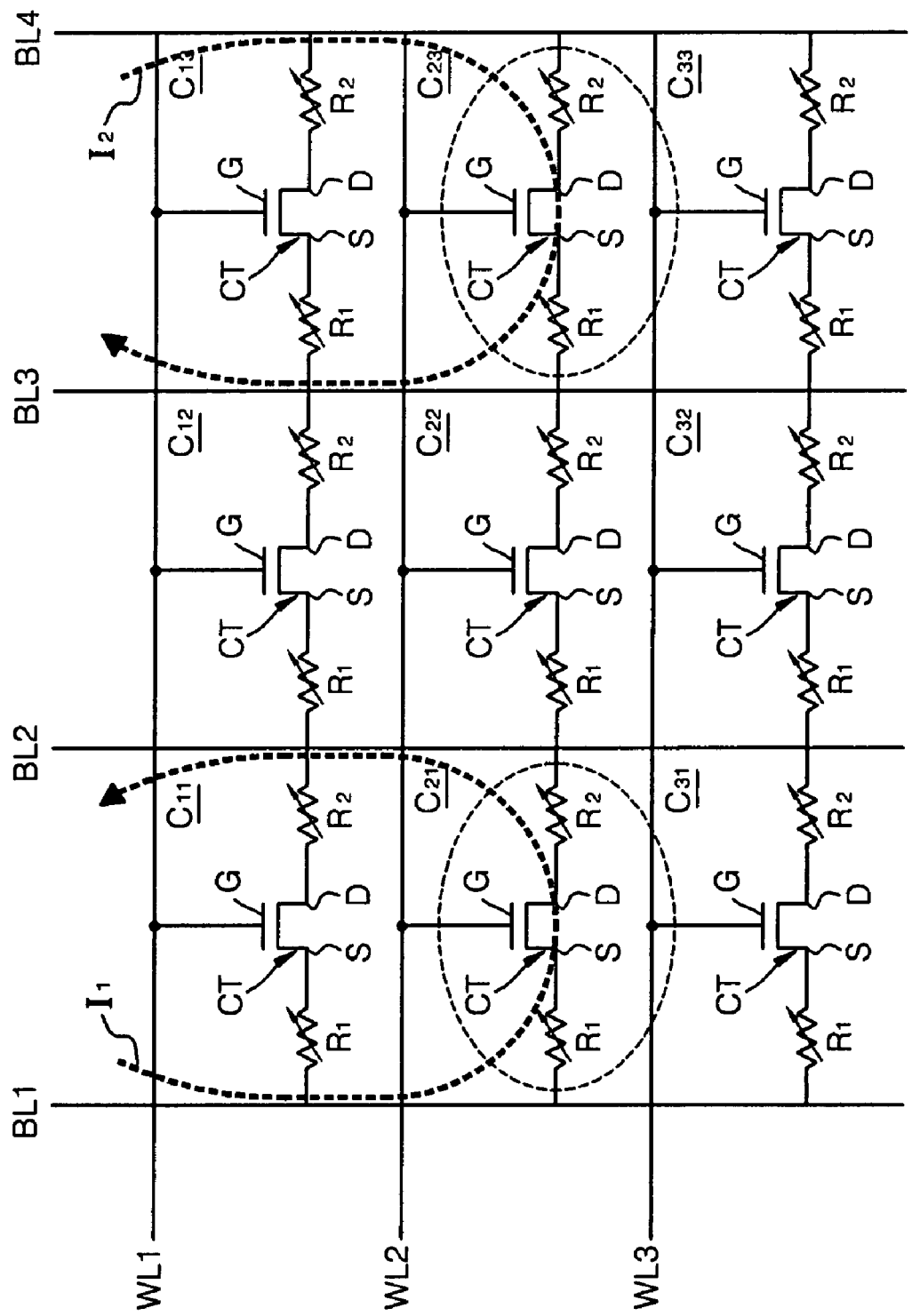
Figure 6:
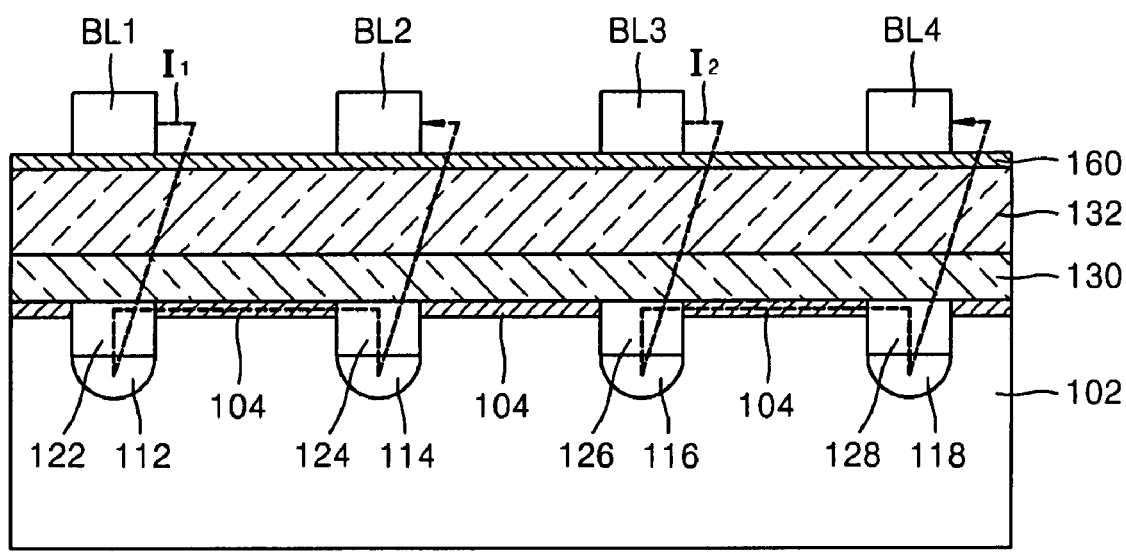

FIG. 5 is a circuit diagram illustrating programming of the nonvolatile memory device according to example embodiments. FIG. 6 is a cross-sectional view illustrating programming of the nonvolatile memory device according to example embodiments.

Referring to FIG. 5, data may be stored in the resistive nodes R1 and R2 of the two selected unit cells C21 and C23 when programming. The turn-on voltage may be supplied to the second word line WL2, thereby turning on all control devices CT of the unit cells C21, C22, and C23 in the second column. A program voltage may be supplied between the first bit line BL1 and the second bit line BL2, and between the third bit line BL3 and the fourth bit line BL4. Thus, first and second currents I1 and I2 may flow through the selected unit cells C21 and C23, respectively. This may allow the resistive state of the resistive nodes R1 and R2 of the selected unit cells C21 and C23 to be changed. The program voltage may be selected according to the types of the resistive nodes R1 and R2.

Referring to FIG. 6, because the first current I1 may flow between the first bit line BL1 and the second bit line BL2, the resistive state in the right portion of the first resistive layer 122 and the left portion of the second resistive layer 124 may be changed. Similarly, because the second current I2 may flow between the third bit line BL3 and the fourth bit line BL4, the resistive state in the right portion of the third resistive layer 126 and the left portion of the fourth resistive layer 128 may be changed. By sequentially supplying the program voltage to two adjacent bit lines, all or some unit cells may be programmed.

Figure 7:
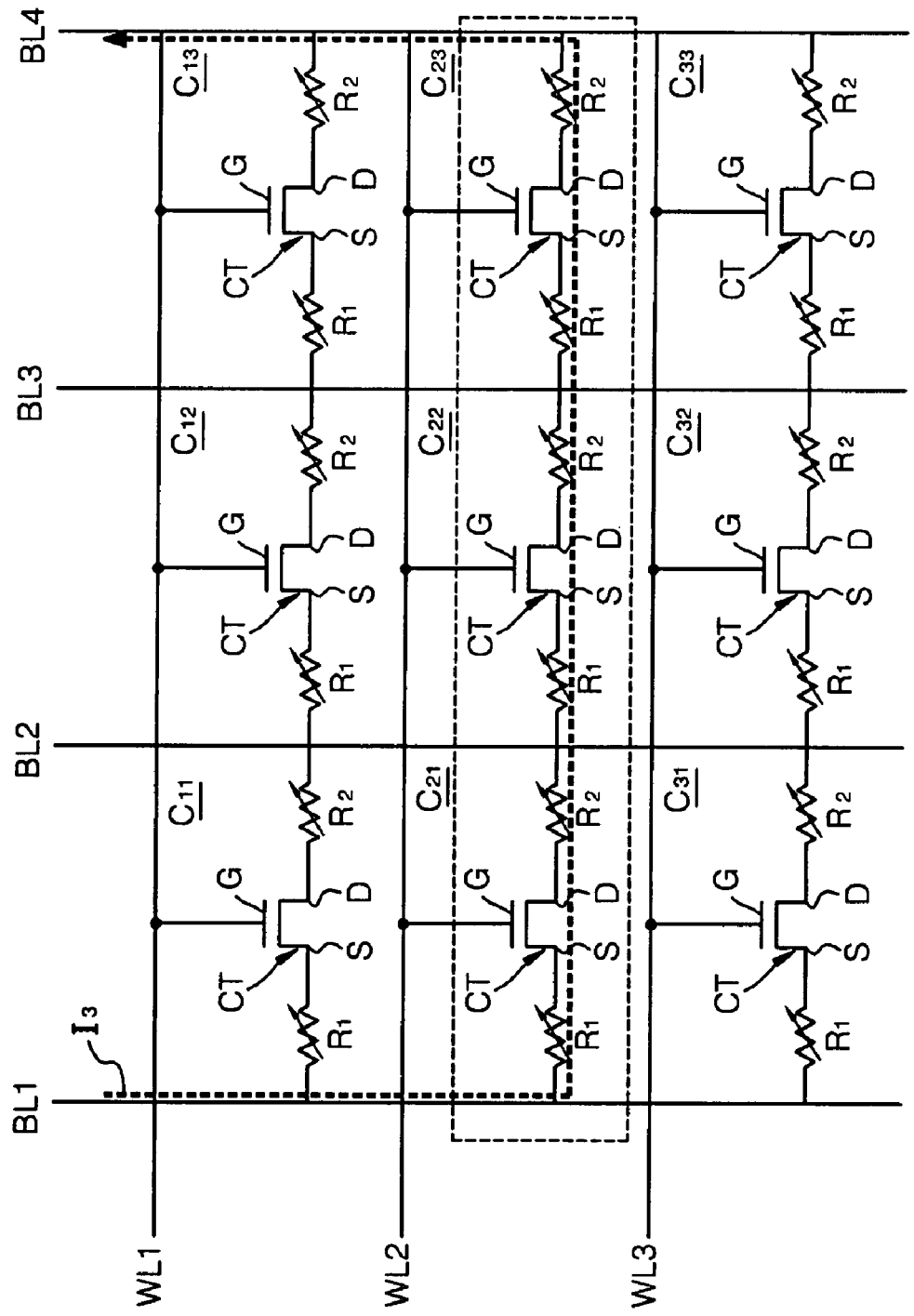
Figure 8:
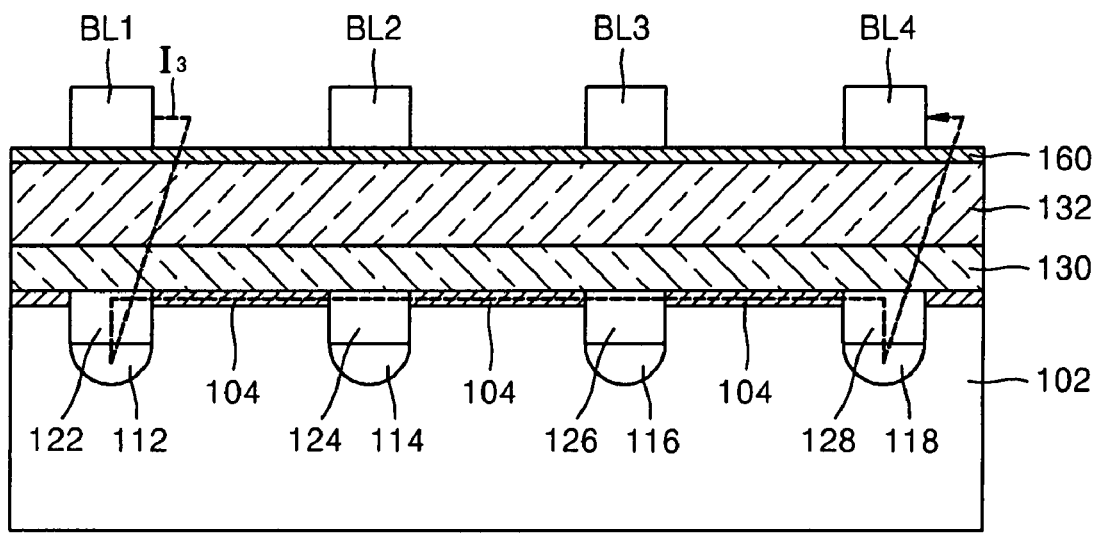

FIG. 7 is a circuit diagram illustrating flash erasing of the nonvolatile memory device according to example embodiments. FIG. 8 is a cross-sectional view illustrating flash erasing of the nonvolatile memory device according to example embodiments.

Referring to FIG. 7, data stored in the resistive nodes R1 and R2 of the unit cells C21, C22, and C23 in the second column may all be erased at one time when flash erasing. Although three unit cells C21, C22, and C23 are illustrated in FIG. 7, more unit cells may be erased at one time.

The turn-on voltage may be supplied to the second word line WL2, thereby turning on all control devices CT of the unit cells C21, C22, and C23 in the second column. An erase voltage may be supplied between the first bit line BL1 and the fourth bit line BL4 in the peripheries of the unit cells C21, C22, and C23 arranged in the second column. This may cause a third current I3 to flow through the unit cells C21, C22, and C23 in the second column, thereby erasing the data stored in the first resistive node R1 and the second resistive node R2. The erase voltage may be in proportion to the number of the unit cells to be erased. The unit cells C21, C22, and C23 may all be erased at one time by a lower operating current.

Referring to FIG. 8, the third current I3 may be induced between the first bit line BL1 and the fourth bit line BL4 so that all data stored in the resistive layers 122, 124, 126, and 128 may be erased at one time. Example embodiments may allow for flash erasing at a higher speed. Therefore, the operating speed of the nonvolatile memory device may be increased.

Example embodiments may allow multi-bit operation of the nonvolatile memory device by varying the programming of the first resistive node R1 of FIG. 5 and the second resistive node R2 of FIG. 5. The direction of the current between the first bit line BL1 and the second bit line BL2 may be changed to vary the programming state of the first resistive node R1 and the second resistive node R2.

Figure 9:
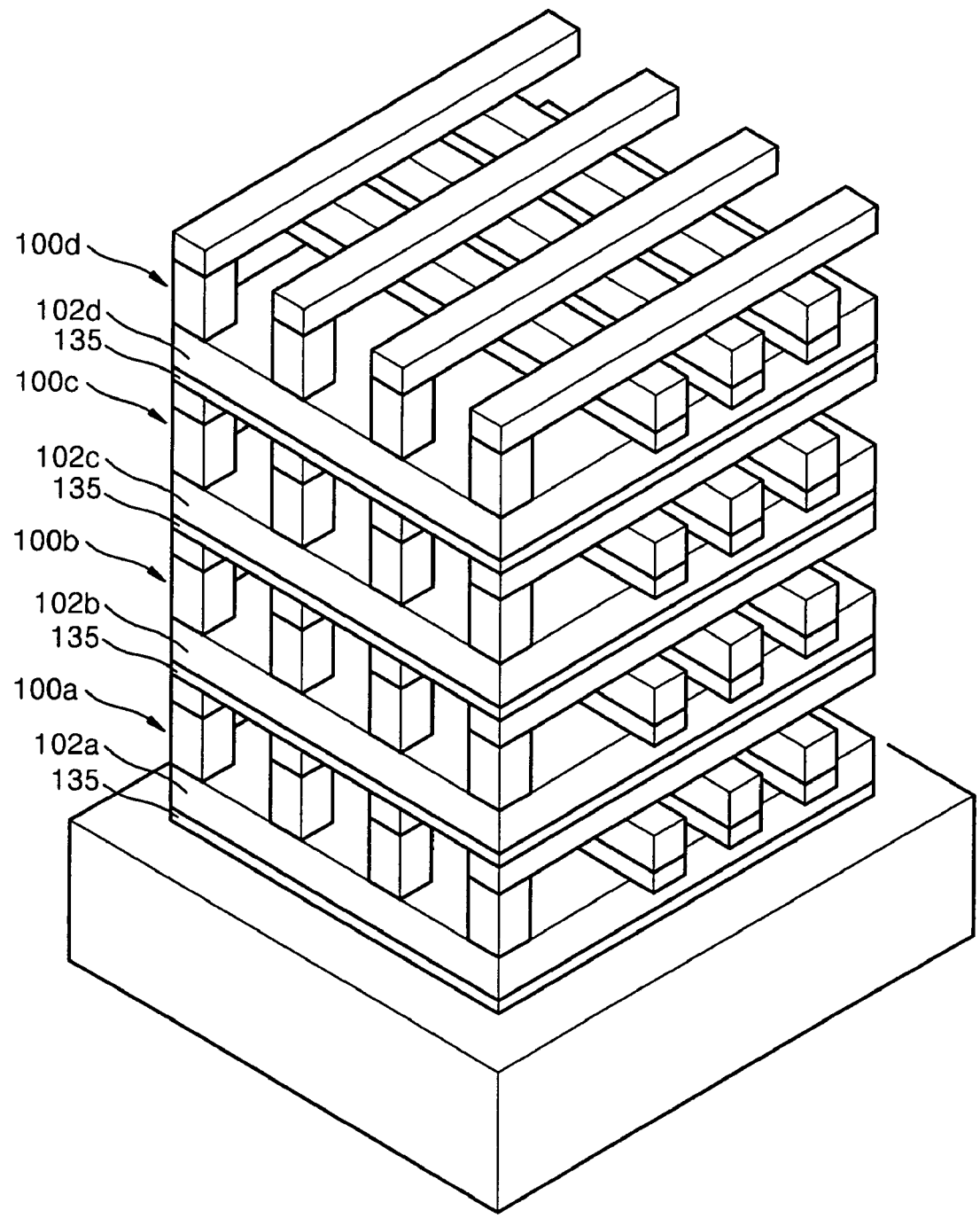

FIG. 9 is a schematic illustrating the structure of a nonvolatile memory device according to example embodiments. The nonvolatile memory device of FIG. 9 may have a structure including a plurality of stacked unit layers, whereas the structure of the nonvolatile memory device illustrated in FIGS. 2 and 3 may be regarded as a unit layer. Therefore, the structure of the unit layer in the nonvolatile memory device illustrated in FIG. 9 may be equivalent to that described with reference to FIGS. 2 and 3. Thus, its description will not be repeated.

Referring to FIG. 9, a plurality of unit layer structures 100a, 100b, 100c, and 100d may be sequentially stacked. A semiconductor substrate 102a of the first unit layer structure 100a may be a silicon wafer or a germanium wafer. Semiconductor substrates 102b, 102c, and 102d of the second, third, and fourth unit layer structures 100b, 100c, and 100d, respectively, may be a MIT material. The second, third, and fourth semiconductor substrates 102b, 102c, and 102d may be formed using material layer deposition. The semiconductor substrates 102a, 102b, 102c, and 102d may be isolated from each other by insulating layers 135.

The stacked layer structure of the unit layer structures 100a, 100b, 100c, and 100d may allow for higher integration than a typical single layer structure. Channel regions 104 of the unit layer structures 100a, 100b, 100c, and 100d may be connected to each other, and gate electrodes 132 may be connected to each other. Thus, the number of unit cells formed on the semiconductor substrate 102a may be increased within the same area.

FIGS. 10 through 15 are cross-sectional views illustrating a method of fabricating the nonvolatile memory device according to example embodiments.

Figure 10:
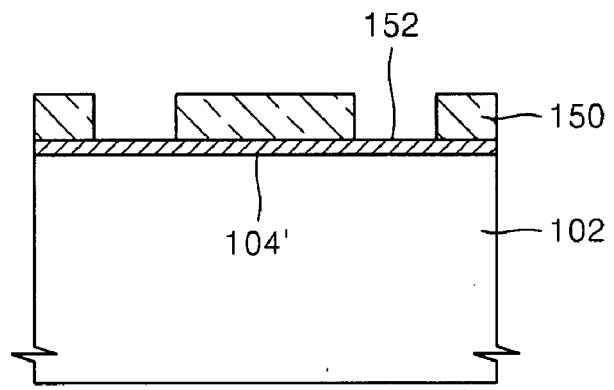

Referring to FIG. 10, a preliminary channel region 104' may be formed on the surface of a semiconductor substrate 102. A mask pattern 150 that exposes predetermined or given portions 152 of the semiconductor substrate 102 may be formed on the semiconductor substrate 102. For example, after forming a silicon oxide layer (not shown), the mask pattern 150 may be formed by patterning the silicon oxide layer using photolithography and etching techniques.

Figure 11:
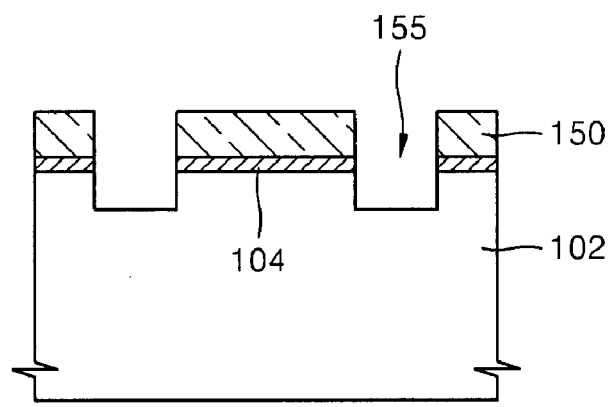

Referring to FIG. 11, the predetermined or given portions 152 of the semiconductor substrate 102 of FIG. 10 exposed by the mask pattern 150 may be etched to form a plurality of trenches 155. The mask pattern 150 may be used as an etch blocking layer to form the trenches 155 by dry etching. As such, the preliminary channel region 104' may be separated, in which the plurality of channel regions 104 may be defined.

Figure 12:
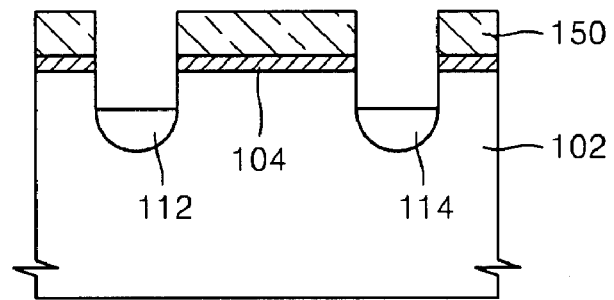

Referring to FIG. 12, a conductive layer (not shown) may be formed around the bottom of the trenches 155 deeper than the channel regions 104, thereby forming a plurality of buried electrodes 112 and 114. The conductive layer may be formed by doping an impurity into the semiconductor substrate 102 around the bottom of the trenches 155. A metal layer or a metal silicide layer may also be formed on the semiconductor substrate 102 around the bottom of the trenches 155 to form the conductive layer. As such, a spacer insulating layer (not shown) may be formed on the sidewalls of the trenches 155 before forming the conductive layer to exclude the metal layer or metal silicide layer from the sidewalls of the trenches 155 that may expose the channel regions 104.

Figure 13:
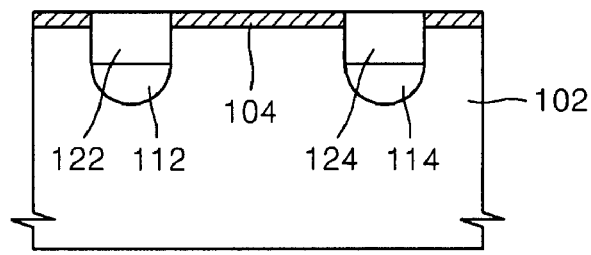

Referring to FIG. 13, a plurality of resistive layers 122 and 124 may be formed on the buried electrodes 112 and 114. The resistive layers 122 and 124 may be connected to end portions of the channel regions 104. A resistive layer material may be formed to cover the buried electrodes 112 and 114 and may fill the trenches 155. The resistive layer material may then planarize to form the resistive layers 122 and 124.

Figure 14:
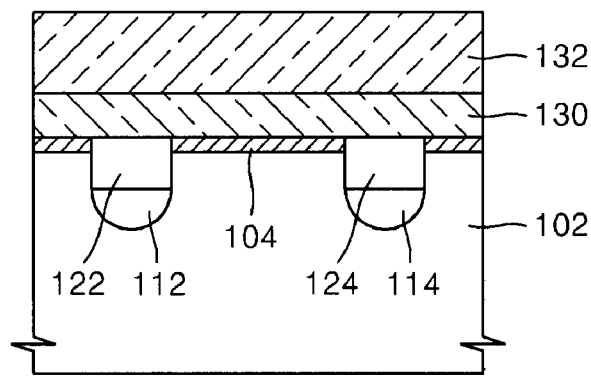

Referring to FIG. 14, gate insulating layers 130 may be formed on the semiconductor substrate 102. The gate insulating layers 130 may be formed on the channel regions 104 and may extend over the resistive layers 122 and 124. Gate electrodes 132 may be formed on the gate insulating layers 130. The gate electrodes may extend over the resistive layers 122 and 124 and may be patterned into a plurality of lines.

Figure 15:
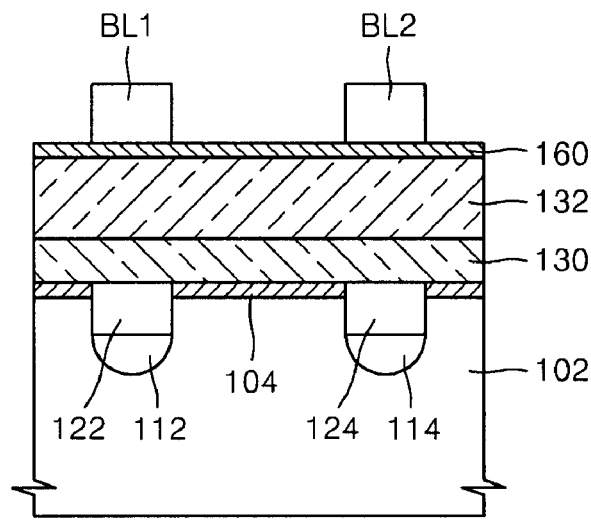

Referring to FIG. 15, interlayer insulating layers 160 may be formed on the gate electrodes 132. The interlayer insulating layers 160 may include a silicon oxide layer or a silicon nitride layer. A plurality of bit lines BL1 and BL2 may be formed on the interlayer insulating layer 160. The bit lines BL1 and BL2 may extend in a different direction from the gate electrodes 132 (e.g., parallel to the buried electrodes 112 and 114). Metal layers (not shown) may be formed on the interlayer insulating layers 160 and may be patterned to form the bit lines BL1 and BL2.

The method of fabricating the nonvolatile memory device may allow for a control device and an electrode structure to be formed simultaneously. Accordingly, fewer photolithography techniques may be required during fabrication which may reduce fabrication cost. Also, the method of fabricating the nonvolatile memory device may use conventional fabricating techniques. Therefore, the method of fabricating the nonvolatile memory device of example embodiments may be economically feasible.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, meansplus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A nonvolatile memory device comprising:
a semiconductor substrate;
a plurality of resistive layers on a surface of the semiconductor substrate storing a variable resistive state;
a plurality of buried electrodes in the semiconductor substrate portions under the plurality of resistive layers and connecting to the plurality of resistive layers;
a plurality of channel regions on the surface of the semiconductor substrate, connecting adjacent resistive layers to each other but not connecting the buried electrodes;
gate insulating layers on the channel regions of the semiconductor substrate; and
gate electrodes on the gate insulating layers extending over the plurality of resistive layers.

2. The nonvolatile memory device of claim 1, wherein the first and second resistive layers include a material having a resistive state which varies according to a voltage supplied to the first and second resistive layers.

3. The nonvolatile memory device of claim 2, wherein the first and second resistive layers each include at least one material selected from the group consisting of $Nb_2O_5$, Cr-doped $SrTiO_3$, $ZrO_x$, $GST(GeSb_xTe_y)$, NiO, ZnO, $TiO_2$, and HfO.

4. The nonvolatile memory device of claim 1, wherein the gate insulating layers extend over the plurality of resistive layers.

5. The nonvolatile memory device of claim 1, further comprising a plurality of bit lines on the semiconductor substrate connecting to the plurality of buried electrodes.

6. The nonvolatile memory device of claim 5, wherein the plurality of bit lines extend in a different direction from the gate electrodes.

7. The nonvolatile memory device of claim 5, wherein the plurality of bit lines are on the gate electrodes by interposing interlayer insulating layers.

8. The nonvolatile memory device of claim 1, wherein the plurality of buried electrodes are formed by doping impurities in portions of the semiconductor substrate.

9. The nonvolatile memory device of claim 8, wherein the semiconductor substrate is doped with impurities of a first conductivity type and the plurality of buried electrodes are doped with impurities of a second conductivity type.

10. The nonvolatile memory device of claim 1, wherein the semiconductor substrate is made of a metal-insulator transition material which has conductivity only when a voltage higher than a threshold voltage is supplied.

11. The nonvolatile memory device of claim 1, wherein the plurality of buried electrodes include a metal layer or a metal silicide layer.

12. A method of operating the nonvolatile memory device of claim 1, including:
programming to store data in two resistive layers out of the plurality of resistive layers; and
flash erasing to simultaneously erase data stored in a number of the resistive layers out of the plurality of resistive layers.

13. The method of claim 12, wherein the programming includes:
supplying a turn-on voltage to the gate electrodes; and
supplying a program voltage between the buried electrodes connected to the two adjacent resistive layers.

14. The method of claim 12, wherein the flash erasing includes:
supplying a turn-on voltage to the gate electrode; and
supplying an erase voltage between the buried electrodes connected to two resistive layers and located under a number of the resistive layers.

15. A method of fabricating a nonvolatile memory device, including:
defining a plurality of channel regions on a surface of a semiconductor substrate;
forming a plurality of buried electrodes in the semiconductor substrate between the plurality of channel regions, the buried electrodes not being connected by the plurality of channel regions;
forming a plurality of resistive layers storing a variable resistive state on a surface of the semiconductor substrate above the plurality of buried electrodes and connecting to the plurality of buried electrodes, adjacent resistive layers being connected by the plurality of channel regions;
forming gate insulating layers on the channel regions of the semiconductor substrate; and
forming gate electrodes on the gate insulating layers extending over the plurality of resistive layers.

16. The method of claim 15, wherein forming the plurality of buried electrodes includes:
forming a mask pattern that exposes the semiconductor substrate portions between the plurality of channel regions;
etching the semiconductor substrate portions exposed by the mask pattern to form a plurality of trenches; and
forming a plurality of conductive layers around the bottom of the plurality of trenches deeper than the plurality of channel regions.

17. The method of claim 16, wherein forming the plurality of conductive layers includes doping impurities around the semiconductor substrate portions around the bottom of the plurality of trenches.

18. The method of claim 16, wherein forming the plurality of conductive layers includes forming metal layers or metal silicide layers on the semiconductor substrate portions around the bottom of the plurality of trenches.

19. The method of claim 16, wherein forming the plurality of resistive layers includes covering a material on the plurality of conductive layers to fill the plurality of trenches such that the plurality of resistive layers are connected to the ends of the plurality of channel regions.

20. The method of claim 15, wherein a resistive state of the first and second resistive layers is varied according to a voltage supplied to both the first and second resistive layers, and the first and second resistive layers include at least one material selected from the group consisting of $Nb_2O_5$, Cr-doped $SrTiO_3$, $ZrO_x$, $GST(GeSb_xTe_y)$, NiO, ZnO, $TiO_2$, and HfO.

21. The method of claim 15, further comprising:
forming interlayer insulating layers on the gate electrodes; and
forming a plurality of bit lines on the interlayer insulating layer connecting to the plurality of buried electrodes.

22. The method of claim 15, wherein the semiconductor substrate includes a metal-insulator transition material having electrical conductivity only when a threshold voltage is supplied.

23. A nonvolatile memory device comprising a plurality of unit layer structures stacked as multiple layers, wherein each of the plurality of unit layer structures includes:

a semiconductor substrate;

a plurality of resistive layers on a surface of the semiconductor substrate storing a variable resistive state;

a plurality of buried electrodes in the semiconductor substrate portions under the plurality of resistive layers and connecting to the plurality of resistive layers;

a plurality of channel regions on the surface of the semiconductor substrate connecting adjacent resistive layers to each other but not connecting the buried electrodes;

gate insulating layers on the channel regions of the semiconductor substrate; and gate electrodes on the gate insulating layers extending over the plurality of resistive layers.

24. The nonvolatile memory device of claim 23, wherein the resistive state of the first and second resistive layers is varied according to a voltage supplied to the first and second resistive layers.

25. The nonvolatile memory device of claim 24, wherein the first and second resistive layers of the plurality of unit layer structures each include at least one material selected from the group consisting of $Nb_2O_5$, Cr-doped $SrTiO_3$, $ZrO_x$, $GST(GeSb_xTe_y)$, NiO, ZnO, $TiO_2$, and HfO.

26. The nonvolatile memory device of claim 23, wherein the semiconductor substrate of the first of the plurality of unit layer structures includes a silicon wafer and semiconductor substrates of the subsequent unit layer structures include a metal-insulator transition material.

27. The nonvolatile memory device of claim 23, wherein the semiconductor substrates of the plurality of unit layer structures are connected to one another.

28. The nonvolatile memory device of claim 23, wherein the gate electrodes of the plurality of unit layer structures are connected to one another.

* * * * *